(12) United States Patent
Saikia et al.

(10) Patent No.: US 10,203,370 B2
(45) Date of Patent: Feb. 12, 2019

(54) SCHEME FOR MASKING OUTPUT OF SCAN CHAINS IN TEST CIRCUIT

(71) Applicant: Synopsys, Inc., Mountain View, CA (US)

(72) Inventors: Jyotirmoy Saikia, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/413,849

(22) Filed: Jan. 24, 2017

(65) Prior Publication Data

US 2017/0131354 A1    May 11, 2017

Related U.S. Application Data

(63) Continuation of application No. 14/303,311, filed on Jun. 12, 2014, now Pat. No. 9,588,179.

(30) Foreign Application Priority Data

Jun. 12, 2013 (IN) .......................... 2555/CHE/2013

(51) Int. Cl.
*G01R 31/317* (2006.01)
*G01R 31/3177* (2006.01)
*G01R 31/3185* (2006.01)

(52) U.S. Cl.
CPC ... *G01R 31/31707* (2013.01); *G01R 31/3177* (2013.01); *G01R 31/318544* (2013.01); *G01R 31/318547* (2013.01)

(58) Field of Classification Search
CPC .. G11C 29/40; G06F 11/1004; G06F 11/0763; G06F 11/08; H05K 999/99; G01R 31/31707; G01R 31/3177; G01R 31/318544; G01R 31/318547
USPC ........................................................ 714/722
See application file for complete search history.

(56) References Cited

U.S. PATENT DOCUMENTS

| | | | |
|---|---|---|---|
| 5,475,695 A | 12/1995 | Caywood et al. | |
| 6,122,756 A | 9/2000 | Baxter | |
| 6,148,425 A * | 11/2000 | Bhawmik | G01R 31/3016 714/25 |
| 6,185,707 B1 | 2/2001 | Smith et al. | |
| 6,288,955 B1 | 9/2001 | Shibano et al. | |

(Continued)

OTHER PUBLICATIONS

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

(Continued)

*Primary Examiner* — Albert Decady
*Assistant Examiner* — Enam Ahmed
(74) *Attorney, Agent, or Firm* — Fenwick & West LLP

(57) ABSTRACT

A method for masking scan chains in a test circuit of an integrated circuit is disclosed. A test pattern to be fed into the test circuit of the integrated circuit is generated. The generated test pattern can be used for detecting a primary fault, one or more secondary faults, and one or more tertiary faults. A mask to mask the output of the scan chains of the test circuit is generated. If a condition is not met, a mask that increases the total number of detectable faults is generated. If the condition is met, a mask that protects the primary fault of the test pattern is generated.

15 Claims, 13 Drawing Sheets

(56) References Cited

U.S. PATENT DOCUMENTS

| | | | |
|---|---|---|---|
| 6,418,545 | B1 | 7/2002 | Adusumilli |
| 6,557,129 | B1 | 4/2003 | Rajski et al. |
| 6,618,830 | B1 | 9/2003 | Balachandran et al. |
| 7,139,948 | B2 | 11/2006 | Rearick et al. |
| 7,370,254 | B2 | 5/2008 | Rajski et al. |
| 7,859,285 | B2 | 12/2010 | Sheu et al. |
| 8,261,142 | B2 | 9/2012 | Guo et al. |
| 8,694,951 | B1 | 4/2014 | Prasanna et al. |
| 8,904,256 | B1 | 12/2014 | Chakravadhanula et al. |
| 2002/0059546 | A1* | 5/2002 | Yonetoku .......... G01R 31/31813 714/738 |
| 2004/0230884 | A1* | 11/2004 | Rajski ............ G01R 31/318566 714/742 |
| 2005/0055617 | A1 | 3/2005 | Wang et al. |
| 2006/0111873 | A1* | 5/2006 | Huang ........... G01R 31/318547 702/185 |
| 2007/0061637 | A1 | 3/2007 | Ward et al. |
| 2007/0143651 | A1 | 6/2007 | Kiryu |
| 2007/0179731 | A1 | 8/2007 | Suri et al. |
| 2007/0234150 | A1 | 10/2007 | Jain et al. |
| 2007/0234169 | A1 | 10/2007 | Rajski et al. |
| 2008/0195346 | A1* | 8/2008 | Lin ................. G01R 31/318575 702/119 |
| 2008/0262761 | A1* | 10/2008 | Nozuyama ....... G01R 31/31835 702/59 |
| 2008/0294955 | A1 | 11/2008 | Kapur et al. |
| 2008/0301510 | A1 | 12/2008 | Kapur et al. |
| 2009/0053628 | A1* | 2/2009 | Ye ...................... G03F 7/70125 430/30 |
| 2009/0240458 | A1 | 9/2009 | Desineni et al. |
| 2010/0017760 | A1 | 1/2010 | Kapur et al. |
| 2010/0090706 | A1 | 4/2010 | Malach et al. |
| 2010/0131910 | A1* | 5/2010 | Sanghani ....... G01R 31/318583 716/113 |
| 2010/0146350 | A1 | 6/2010 | Lin et al. |
| 2010/0192030 | A1 | 7/2010 | Kapur et al. |
| 2011/0239068 | A1 | 9/2011 | Whetsel |
| 2011/0258498 | A1 | 10/2011 | Chandra et al. |
| 2011/0307750 | A1 | 12/2011 | Narayanan et al. |
| 2013/0173979 | A1* | 7/2013 | Goessel .......... G01R 31/318547 714/727 |
| 2014/0229779 | A1* | 8/2014 | Rajski ............ G01R 31/318547 714/726 |

OTHER PUBLICATIONS

Chandra. A. et al., "Scalable Adaptive Scan (SAS)," EDAA, 2009, 6 pages.
Devanathan, V.R. et al., "Reducing SoC Test Time and Test Power in Hierarchical Scan Test: Scan/Architecture and Algorithms," IEEE 20th Int'l Conference on VLSI Design, VLSID'07 2007, 6 pages.
Dutta et al., "Using Limited Dependence Sequential Expansion for Decompressing Test Vectors," IEEE Int'l Test Conference, 2006, Paper 23.1, pp. 1-9.
Gonciari, P.T. et al., "Compression Consideratons in Test Access Mechanism Design," IEE Proc.-Comput. Digit. Tech. Jan. 2005, pp. 89-96, vol. 152, No. 1.
Iyengar, V. et al., "A Unified SOC Test Approach Based on Test Data Compression and TAM Design," Proceedings of the 18.sup.TH IEEE International Symposium on Defect and Fault Tolerance in VLSI Systems, (DFT'03): IEEE, 2003, 8 pages.
Iyengar, V. et al., "Test Access Mechanism Optimization, Test Scheduling, and Tester Data Volume Reduction for System-on-Chip," IEEE Transactions on Computers, Dec. 2003, pp. 1619-1632, vol. 52, No. 12. C.
Kapur, R, et al., "Manufacturing Test of SoCs," Proceedings of the 11th Asian Test Symposium, (ATS'02), IEEE, 2002, 3 pages.
Larsson, A. et al., "Test-Architecture Optimization and Test Scheduling for SOCs with Core-Level Expansion of Compressed Test Patterns," EDAA, 2008, pp. 188-193.
Nadeau-Dostie, B. et al., "Improved Core Isolation and Access for Hierarchical Embedded Test," IEEE Design & Test of Computers, Jan./Feb. 2009, pp. 18-25.
Remmers, J. et al.,"Hierarchical DFT Methodology—A Case Study," ITC International Test Conference, IEEE, 2004 Paper 30.2, pp. 847-856.
Sinanoglu, O., et al., "A Non-Intrusive isolation Approach for Soft Cores," EDAA, 2007, pp. 27-32.
Srinavasan, P. et al., "Hierarchical DFT with Combinational Scan Compression, Partition Chain and RPCT." 2010 IEEE Annual Symposium on VLSI, IEEE, 2010, pp. 52-57.
Su et al., "Multiple Path Sensitization or Hierarchical Circuit Testing," IEEE 1990 International Test Conference, Paper 6.2, pp. 152-161.
Su et al., "Computer-Aided Design of Pseudoexhaustive BIST for Semiregular Circuits," 1990 IEEE International Test Conference, 1990, Paper 30.4, pp. 680-689.
Wohl, P. et al., "Fully X-tolerant Combinational Scan Compression," 2007 IEEE International Test Conference, IEEE, 2007: Paper 6.1, pp. 1-10.
Wohl, P. et al., "Minimizing the Impact of Scan Compression," 25th IEEE VLSI Test Symposium (VTS'07), IEEE, 2007, 8 pages. C.
Xu, Q. et al., "Modular and Rapid Testing of SOCs With Unwrapped Logic Blocks," IEEE Transactions on Very Large Scale Integration (VLSI) Systems, Nov. 2005, pp. 1275-1285, vol. 13, No. 11.
Remersaro, S. et al., "A Scalable Method for the Generation of Small Test Sets," Proceedings of the Conference on Design, Automation and Test in Europe, European Design and Automation Association, EDAA, 2009, 6 pages.
United States Office Action, U.S. Appl. No. 14/303,311, dated Feb. 16, 2016, 9 pages.

* cited by examiner

```
Shift:  0 --> 00101011101101110100101011100110101 1X1011101110001
Shift:  1 --> 01010111001011001111010111000110110X0111010100010
Shift:  2 --> 00101110001110011011101110001000111 1X1110111000101
Shift:  3 --> 01011100010100110011011100010101101011101111001010
Shift:  4 --> 0011100010000110011011100010101101111100110 00X0101
Shift:  5 --> 0110000X010011001100100001010110010010 0X10001X1011
Shift:  6 --> 0100001X10111011000000010101000101000 0X00X10X0110
Shift:  7 --> 0001010X01010100100101010101110111010 01X00X01X11X0
Shift:  8 --> 1010101X11101001101010101011001000010 10X01X10110X1
Shift:  9 --> 0101X10X100100001001000101100000101010 10X01100X0
Shift: 10 --> 10X1X011001001110110101011001000111101010 10X1X1
Shift: 11 --> 01X0X11001101111100110011001000101001011101100X011
Shift: 12 --> 11X0X100100110110111011100101010101101100110 01X110
Shift: 13 --> 1001100101010110111000100101100101001100110010X100
Shift: 14 --> 00110010110010001000100010110010101010011001011001
Shift: 15 --> 01100101100101000001100101100001010000100010110011
Shift: 16 --> 1100101100010010110001011001011100 1X1010111X00110
Shift: 17 --> 10X001100100001010010001100111100001X0111001X01100
Shift: 18 --> 00X011001100010100110011001100000011011001 10X11000
Shift: 19 -->                                10X1001110X10000
```

FIG. 5A

```
Shift:  0 --> X010101XXXX1XXXXX100101011XXXXX0XX11XX011101XXXXXXX
Shift:  1 --> X10101XXXX1XXXXX1X1101011XXXXX1XX110XX11101XXXXXXX
Shift:  2 --> 00101XXXX0XXXXX1XX111011XXXXX0XX1111XX1101XXXXXXX
Shift:  3 --> X101XXXX0XXXXX1XXX11011XXXXX0XX1101XXX101XXXXXXXX0
Shift:  4 --> X01XXXX0XXXXX1XXX11011XXXXX0XX1101XXXX00XXXXXXXX01
Shift:  5 --> X1XXXX0XXXXX1XXX11001XXXXX0XX1100XX0XX0XXXXXXXXX011
Shift:  6 --> XXXXX0XXXXX1XXX10000XXXXX0XX1000XX10XXXXXXXXXX011X
Shift:  7 --> XXXX0XXXXX0XXX00100XXXXX0XX1110XX101XXXXXXXXXX11XX
Shift:  8 --> 1XX0XXXXX1XXX00110XXXXX0XX1100XX0001XXXXXXXXXX1XXX
Shift:  9 --> 0X0XXXXX1XXX00001XXXXX0XX1100XX0101XXXXXXXX0XXXXXX
Shift: 10 --> 10XXXXX1XXX00111XXXXX0XX1100XX0011XXXXXXXX01XXXXXX
Shift: 11 --> 0XXXXX1XXX10111XX0XX1XX1100XX0010XXXXXXXX011XXXXX1
Shift: 12 --> XXXXX1XXX00110XX01X1XX1100XX1010XXXXXXXX011XXXXX10
Shift: 13 --> XXXX1XXX01010XX0111XX0100XX1100XXXX0XXX011XXXXX100
Shift: 14 --> 0XX1XXX01100XX0010XX1000XX1100XXXX10XX011XXXXX1001
shift: 15 --> 0X1XXX01100XX10000X1100XX1100XXXX100XX10XXXXXX0011
Shift: 16 --> 11XXX01100XX1001011000XX1100XXXX1001XX0XXXXXXX0110
Shift: 17 --> 1XXX01100XX0001010010XX1100XXXX00001XXXXXXX1XX1100
Shift: 18 --> XXX01100XX0001010011XX1100XXXX000011XXXXXX10XX1000
Shift: 19 -->                            10XXXXX110XX0000
```

FIG. 5B

```
Shift:  0 --> 0XX1XX1X010111011101110111111110111001X00X01X0XX0XX0
Shift:  1 --> 0XX0XX0X001110011111001111000111011X00X11X0XX0XX0
Shift:  2 --> 0XX1XX1X011100100101100001110001110X01X11X0XX0XX0
Shift:  3 --> 0XX1XX1X011000101101111111111111000X11X11X0XX0XX0
Shift:  4 --> 0XX1XX1X110001111111111111111111000X11X10X0XX0XX0
Shift:  5 --> 0XX1XX0X10101111101001110000110001X11X01X0XX0XX0
Shift:  6 --> 0XX0XX1X010111100011111111000111X10X11X0XX0XX0
Shift:  7 --> 0XX0XX1X100111001101000001101101111X01X10X0XX0XXX
Shift:  8 --> 1XX1XX1X111110010001110000111011011X11X00X0XX0XXX
Shift:  9 --> 1XX0XX1X100101011110110111101101110X11X00X0XX0XXX
Shift: 10 --> 1XX0XX0X011011111010001110000010000X10X01X0XXXXXX
Shift: 11 --> 1XX0XX0X111111100101100000000010111X01X11X0XXXXX0
Shift: 12 --> 0XX0XX0X100110011111100001000011111X10X11X0XXXXX0
Shift: 13 --> 1XX0XX1X000101111010000001111010111X00X11XXXXXXXX0
Shift: 14 --> 1XX1XX1X00001010000000000010001001X00X10XXXX0XX0
Shift: 15 --> 1XX0XX0X010100000000000001000011X00X0XXXXX0XX0
Shift: 16 --> 1XX0XX1X110000000101101110000001100X00XXXXXXX0XX0
Shift: 17 --> 0XX0XX1X110000111110000000011100000X01XXXX0XX0XX0
Shift: 18 --> 0XX0XX0X110001110111011100011110000X1XXXXX0XX0XX0
Shift: 19 -->                                 00X1XXXX1X0XX0XX0
```

FIG. 5C

SCHEME FOR MASKING OUTPUT OF SCAN CHAINS IN TEST CIRCUIT

CROSS REFERENCE TO RELATED APPLICATION

This application is a Continuation Application of U.S. patent application Ser. No. 14/303,311, filed Jun. 12, 2014, which claims the benefit of priority under 35 U.S.C. § 119(a) to Indian Provisional Patent Application No. 2555/CHE/2013 filed Jun. 12, 2013, both of which are incorporated by reference herein in their entirety.

BACKGROUND

1. Field of the Disclosure

The present disclosure relates to masking one or more scan chains in a testing circuit for testing an integrated circuit to prevent propagation of unknown values.

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop.

Outputs of multiple scan flops may be compressed into a bit stream to reduce data bandwidth and pins associated with the testing of the IC. Compression of the output of the scan flop into a bit stream decreases the amount of information that may be extracted from the bit stream. For instance, an unexpected value on one of the bits of the bit stream may be associated with multiple scan flops and determination as to which scan flop caused the unexpected value may not be easily made.

An unknown value in the output of a scan chain is designated "X" to represent that it could be either a logic 0 or logic 1 in the expected scan-out data stream. X response values in output of scan chains are undesirable because it is unknown whether the design is faulty based on the scan output. In standard scan testing without compression, X values are simply ignored. However, when scan data is compressed, X values can interfere with known values and reduce fault coverage. Therefore, compression of scan output can reduce observability and worsen test coverage.

SUMMARY

Embodiments relate to generating a mask for masking scan chains in a test circuit of an integrated circuit. A different criterion for generating the mask is used based on whether one or more conditions have been met. If the one or more conditions have not been met, a mask that increases the total number of faults of a test pattern is generated. Alternatively, if the one or more conditions have been met, a mask that protects a primary fault of associated with the test pattern is generated.

In some embodiments, a mask that increases the total number of faults masks scan chains that have a number of undetermined values ("X" values) greater than a threshold number. In some embodiments, a mask that protects a primary fault masks scan chains that have undetermined values that would be combined with the primary fault during a scan out process.

BRIEF DESCRIPTION OF THE DRAWINGS

The teachings of the embodiments can be readily understood by considering the following detailed description in conjunction with the accompanying drawings.

FIG. 5A is an expected output pattern of a fault free IC for a particular test pattern, according to one embodiment.

FIG. 5B is an expected output pattern corresponding to a particular test pattern when masking is not performed, according to one embodiment.

FIG. 5C is an expected output pattern corresponding to a particular when masking is performed, according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
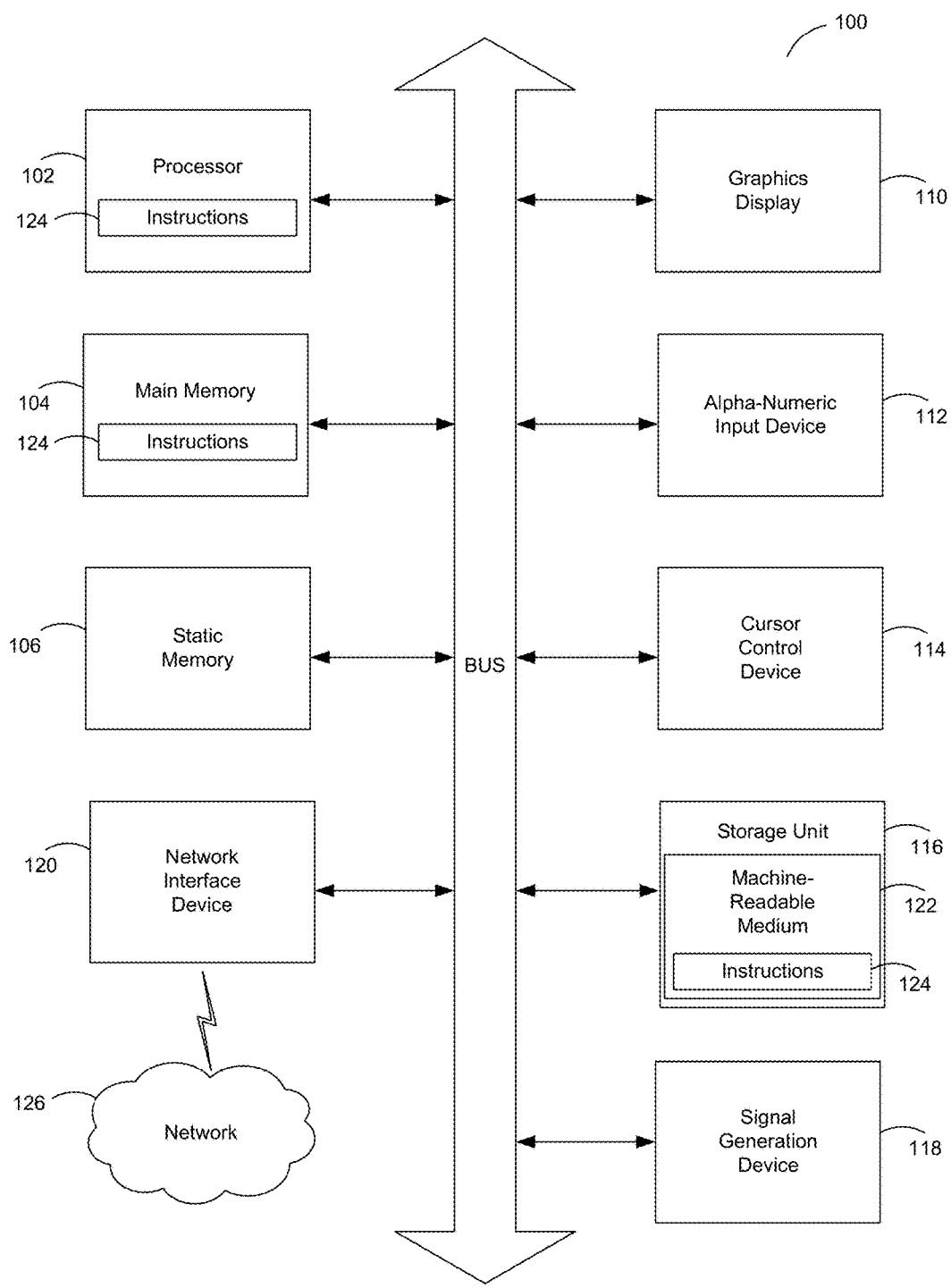
FIG. 1 is a block diagram of an example machine for executing electronic design automation (EDA) process, according to one embodiment.

FIG. 1 is a block diagram of an example machine for executing electronic design automation (EDA) process, according to one embodiment. Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 104, and a static memory 106, which are configured to communicate with each other via a bus 108. The computer system 100 may further include graphics display unit 110 (e.g., a plasma display panel (PDP), a liquid crystal display (LCD), a projector, or a cathode ray tube (CRT)). The computer system 100 may also include alphanumeric input device 112 (e.g., a keyboard), a cursor control device 114 (e.g., a mouse, a trackball, a joystick, a motion sensor, or other pointing instrument), a storage unit 116, a signal generation device 118 (e.g., a speaker), and a network interface device 120, which also are configured to communicate via the bus 108.

The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media. The instructions 124 (e.g., software) may be transmitted or received over a network 126 via the network interface device 120. The instructions 124, for example, include code for executing EDA processes.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Figure 2A:
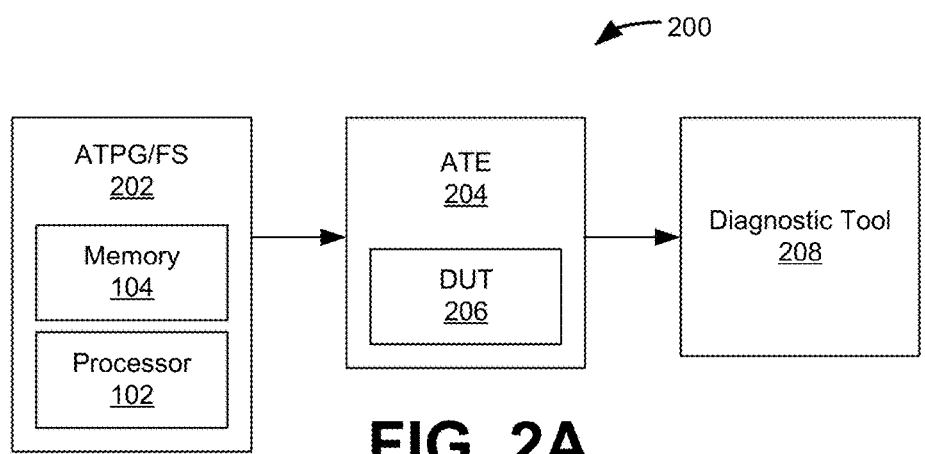
FIG. 2A is a block diagram illustrating a system for testing and diagnosing a device under test (DUT), according to one embodiment.

FIG. 2A is a block diagram illustrating a system 200 for testing and diagnosing a device under test (DUT) 206, according to one embodiment. DUT 206 is an integrated circuit (IC) that is being tested for faults in its fabrication process. The system 200 may include, among other components, an automatic test pattern generator/fault simulator (ATPG/FS) 202, an automatic test equipment (ATE) 204, and a diagnostic tool 208. One or more of these components may be combined into a single product or device.

ATPG/FS 202 generates test patterns provided to ATE 204 and scan-out values corresponding to the test patterns for detecting faults in DUT 206. In some embodiments, ATPG/FS 104 includes a memory 104 that stores instruction for generating the test patterns. ATPG/FS 202 may also include a processor 102 that reads the instructions stored in memory 104 and executes the instructions to generate test patterns and control signals to be fed into DUT 206. Scan-out values represent the expected output from a faultless integrated circuit when provided with the test patterns. A test pattern includes scan-in data and control data for controlling test operation in DUT 206, as described below in detail with reference to FIG. 3A. ATE 204 provides the test patterns as scan-in data and control data to DUT 206, and captures output from DUT 206. The captured output from DUT 206 is compared with scan-out values. ATE 204 then generates fault data indicating the difference in the scan-out values and the output from DUT 206.

ATE 204 then sends fault data to diagnostic tool 208 to localize and diagnose the cause of faults in DUT 206. If a fault is detected based on an unexpected output of DUT 206, diagnostic tool 208 may request ATPG/FS 202 to generate further test patterns to localize or specify a scan flop associated with the unexpected value.

Figure 2B:
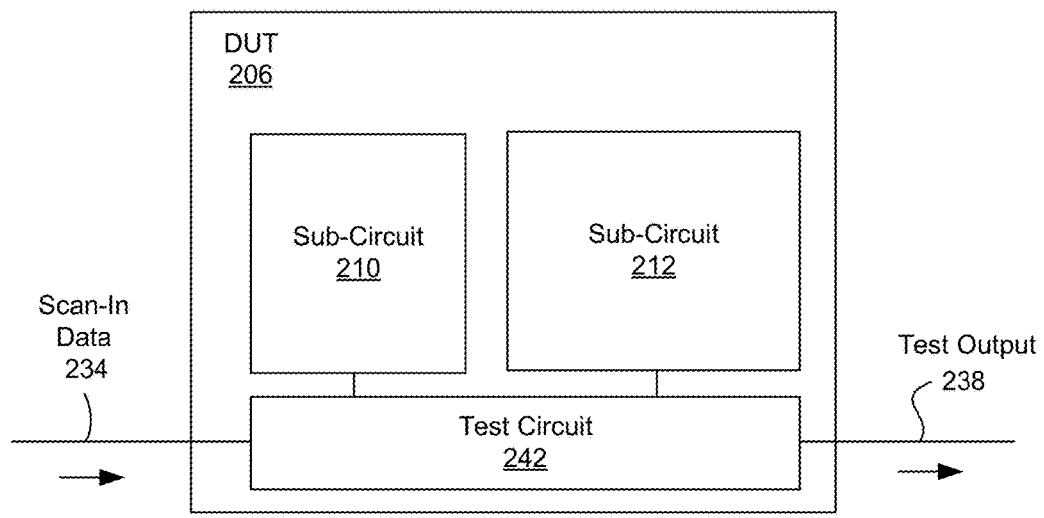
FIG. 2B is a block diagram of a DUT including a test circuit, according to one embodiment.

FIG. 2B is a block diagram of DUT 206 including a test circuit 242 for performing testing of sub-circuits in DUT 206, according to one embodiment. DUT 206 may include, among other components, one or more sub-circuits 210, 212 and test circuit 242. DUT 206 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 202 and sending test output data 238 (i.e., an output in response to the test patterns) to diagnostic tool 208.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2B as testing both sub-circuits 210, 212, more than one test circuit may be provided in DUT to separately test a certain sub-circuit. In embodiments with multiple test circuits, each test circuit may be connected to the same or different pins.

As described herein, a test pattern may detect one primary fault in the DUT, and a combination of secondary and tertiary faults in the DUT. A primary fault herein refers to a fault for which an initial subset of input values in the test pattern is generated. The ATPG/FS 202 may select a primary fault from a pool of faults to be tested and may populate the test pattern with the subset of input values for testing the primary fault.

After the initial subset of input values for testing the primary fault is populated into the test pattern, ATPG/FS 202 may select one or more secondary faults from the pool of faults to be tested using the same test pattern. A secondary fault herein refers to a fault that can be tested by adding additional input values to the test pattern populated with the subset of input values for the primary fault. ATPG/FS 202 attempts to populate the portion of the test pattern unused by the subset of the initial values (for detecting the primary fault) with another set of input values for testing the secondary faults. If the other set of input values for testing a secondary fault cannot be included in the test pattern (e.g., there is no available locations in the test pattern to fit in the input values needed to test the secondary fault), then ATPG/FS 202 may return the secondary fault to the pool of faults for testing in a different test pattern.

After the input values for test the secondary faults are included in the test pattern, empty locations in the test pattern are filled with filler values (e.g., 1s or 0s). Oftentimes after the test pattern has been generated, a plurality of tertiary faults testable using the generated test pattern can be identified. As used herein, a tertiary fault is a fault that can be tested using a particular test pattern, but was not considered during the generation of the test pattern. In many cases, the number of tertiary faults of a test pattern may outnumber the number of primary or secondary faults in the same test pattern.

For example the scan-in data of a test pattern for a DUT 206 may be 30 bits long. The ATPG/FS 202 may select a primary fault and populate the 30 bit long scan-in data of the test pattern for testing the primary fault. For instance, the scan-in data for testing the primary fault may include the following bits:

******010010*************

Where "*" is a scan-in value that does not affect the testing of the primary fault. That is, the test pattern can be used to test the primary fault regardless of whether the "*" values are 0s or 1s.

When the scan-in data has been populated for testing the primary fault, the ATPG/FS 202 may select a secondary fault and populate the scan-in data to test the secondary fault in addition to the primary fault. For instance, the scan-in data may include the following bits:

******010010101101********

The ATPG/FS 202 may select additional secondary faults to populate the "*" values of the scan-in data of the test pattern. For instance, the ATPG/FS 202 may populate the scan-in data for testing three secondary faults and the primary fault may look as follows:

001110010010101101**110001

After the test pattern has been populated to test the secondary faults and the primary fault, the remaining "*" values of the test pattern are populated with filler values. For instance, the test pattern may be filled with is and may look as follows:

110011100100101110110111110001

Such test pattern generated by populating bits for the primary fault and the secondary faults can incidentally detect other faults that were not originally intended while populating the test pattern. These faults for which the test pattern was not originally considered are referred to as tertiary faults.

Figure 3A:
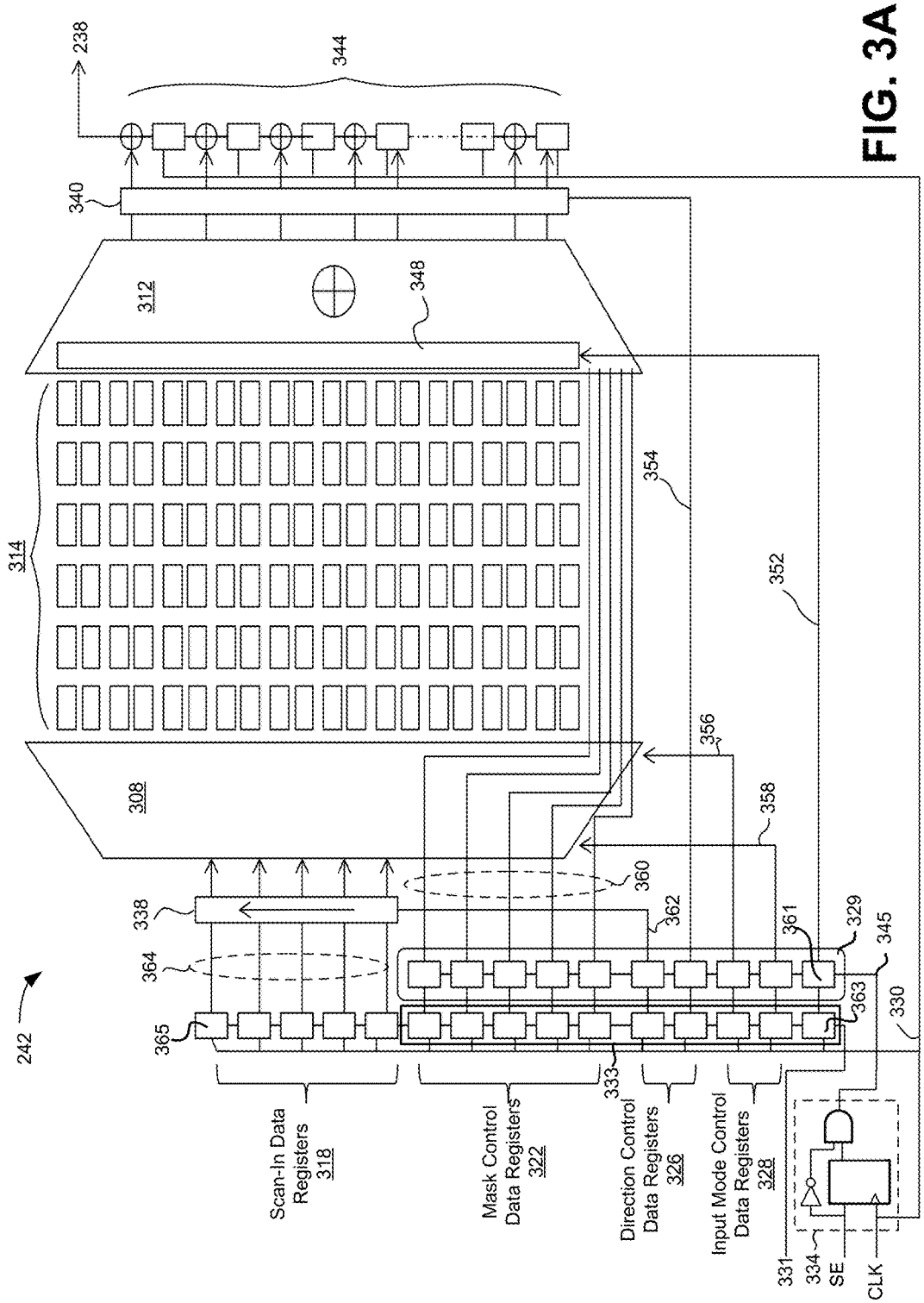
FIG. 3A is a circuit diagram of a test circuit in the DUT, according to one embodiment.

FIG. 3A is a circuit diagram of test circuit 242 in the DUT 206, according to one embodiment. Test circuit 242 may include, among other components, a decompressor 308, a compressor 312, chains of scan flops 314, input registers 318, 322, 326, 328, 329, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329.

Control logic 334 synchronizes the operation of components in test circuit 242 by providing a clock signal via line 345. When a clock signal is input to current control registers 329, the bit values in control registers 333 are loaded onto current control registers 329. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom of the register chain up to a scan-in data registers 365 at the top of the register chain as bits for the current test pattern is received via line 331. Although a single line 331 is illustrated in FIG. 3A as receiving the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 via line 345. Current registers 329 stores control values until the next capture clock so that decompressor 308 and compressor 312 can be controlled without undergoing change with every shift of scan-in data. That is, registers 333 enable control values to be shifted to register 329 only once per pattern.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
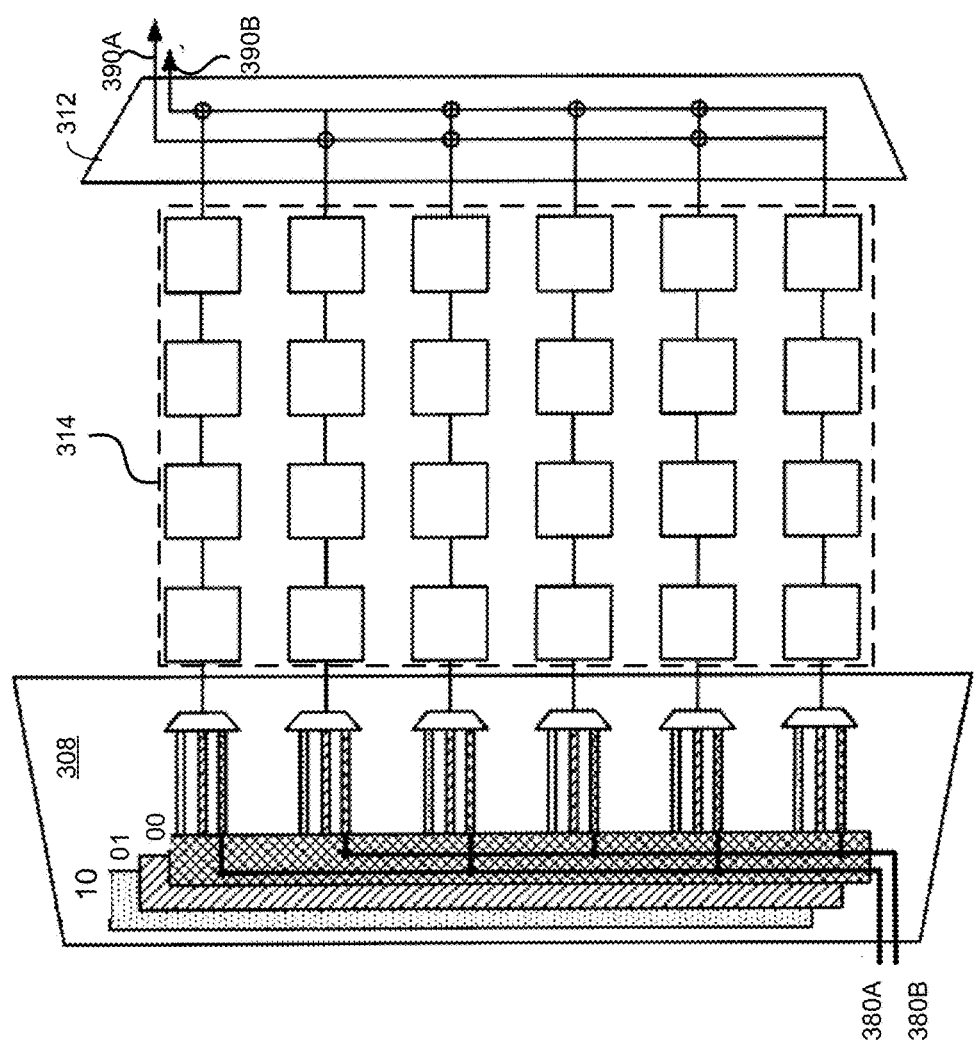
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask control data registers 322 of the current control registers 329 define the masking of certain scan chains. The bit values of mask control data registers 322 are provided to compressor 312 via lines 360. In response to receiving mask enable signal via line 352 and active signals in lines 360, a mask block 348 in compressor 312 masks certain scan chains as defined by the bit values of mask control data registers 322. In one embodiment, the mask enable bit value stored in register 361 is sent to mask block 348 to enable or disable masking operation via line 352. In another embodiment, the mask enable bit value stored in register 361 is used for choosing a masking style. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of current control registers 329 store bit values for a current test pattern and other current control registers 329 store bit values for a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are for the current test pattern. Conversely, bit value in direction control data registers 326 of current control registers 329 controlling output direction block 340 for the current test pattern, bit values in mask control data registers 322 of current control registers 329, a bit value in mask enable register 361 of current control registers 329 are for the previous test pattern. This mixture of control values at 329 is due to the fact that, while one pattern is being loaded through line 331, the previous pattern is being unloaded through line 329.

FIG. 3B is a conceptual diagram illustrating the operation of decompressor 308 and compressor 312 in a test circuit, according to one embodiment. Decompressor 308 may be selected to operate in one of the selected modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 204 and diagnostic tool 208 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

For example, the compressor of FIG. 3B compresses the output of the test circuit into two output values 390A and 390B. Output 390A of FIG. 3B is the result of the XOR operation between the output of the first scan chain, the third scan chain, the fourth scan chain, the fifth scan chain and the sixth scan chain. Hence, an unexpected value in output 390A may originate from faults associated with any one or more of the first scan chain, the third scan chain, the fourth scan chain, the fifth scan chain and the sixth scan chain. Similarly, output 390B of FIG. 3B is the result of the XOR operation between the output of the second scan chain, the third scan chain, the fifth scan chain and the sixth scan chain. Hence, an unexpected value in output 390B may originate from faults associated with any one or more of the second scan chain, the third scan chain, the fifth scan chain and the sixth scan chain. In order to identify the exact scan chain and/or scan flop causing the unexpected values in the outputs, additional test patterns or analysis may be needed.

As described above with reference to FIG. 3A, mask block 348 is used for masking certain scan chains as defined by the bit values of mask control data registers 322. The masking is done to prevent propagation of unknown "X" values in certain scan chains. However, the probability of "X" values occurring in each scan chain may be different. For outputs from scan chains less likely to include "X" values, it is preferable to combine outputs from more scan chains for higher compression ratio. Conversely, for outputs from scan chains more likely to include "X" values, it is preferable to limit combination with outputs from other scan chains to prevent propagation of "X" values.

In one or more embodiments, the outputs from scan chains are a combination of multiple fanouts and a single fanout. Fanout of a scan chain described herein refers to the number of inputs of the compressor 312 which receives the output of the scan chain. For example, a scan chain with three fanout propagates the output of the scan chain to three inputs of the compressor 312. In this example, the output of a scan chain may fanout to input terminals of three other XOR gates in the compressor 312 for compression. Three fanout is generally understood as a good compromise between reasonable range of fault detection and reasonable degree of compression. However, different number of fanouts (e.g., two fanout or four fanout) may also be used. The arrangement concerning which scan chains to have multiple fanouts and a single fanout as well as which scan chains should have dedicated control data bits are set by the control data.

Figure 4A:
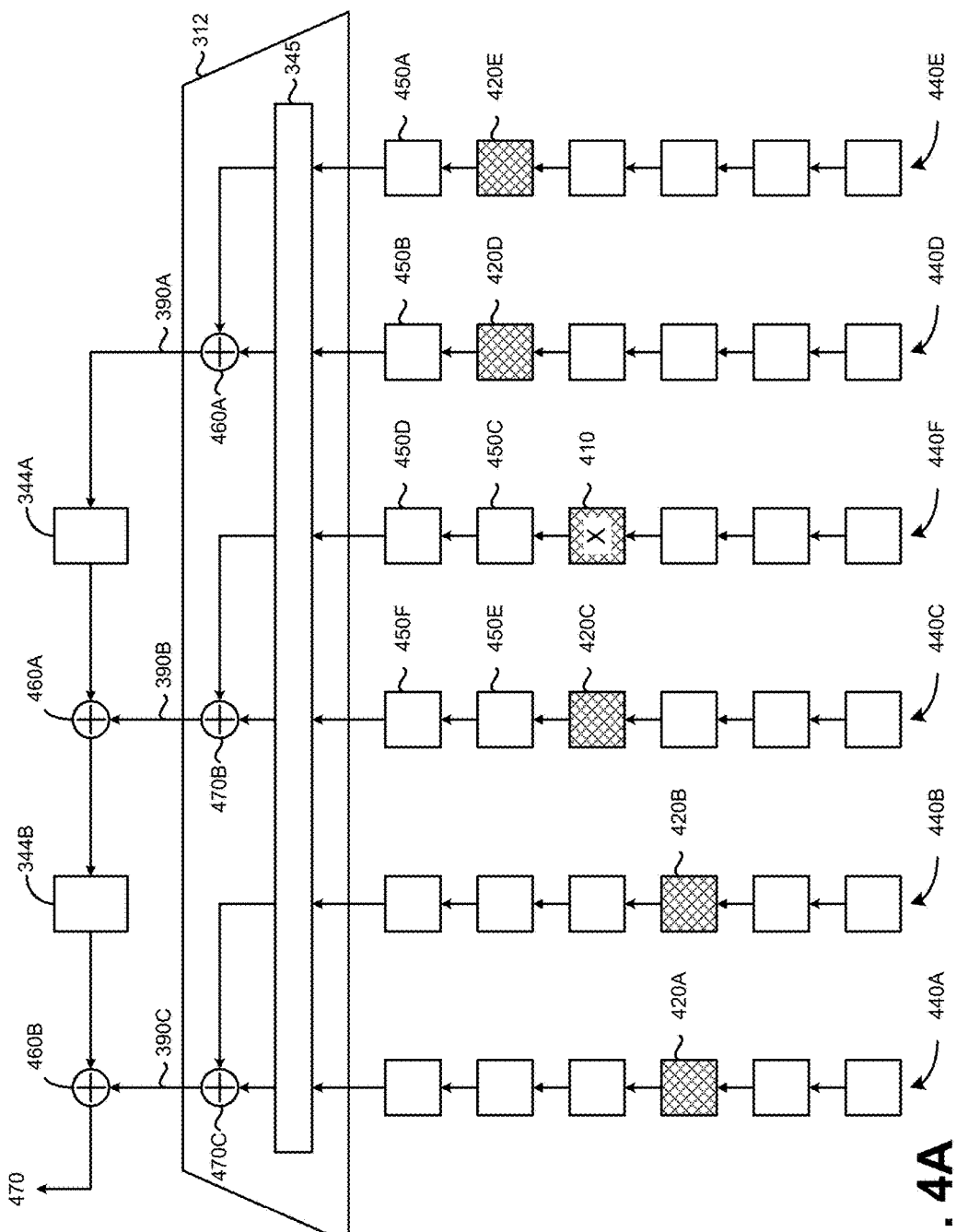
FIG. 4A is a block diagram of a test circuit with a scan register having an "X" value, according to one embodiment.

FIG. 4A illustrates a test circuit 242 with a scan register 410 having an "X" value, according to one embodiment. In the embodiment of FIG. 4A, scan chain 440F, which contains scan register 410 is not masked. Due to the compression of the output, when scan chain 440F is not masked, the "X" value from scan register 410 propagates to other scan registers. For instance, in the example of FIG. 4, the "X" value in scan register 410 would propagate to scan registers 420A-420E.

During a first scan out clock cycle, the content of scan register 420E is shifted to scan register 450A, the content of scan register 420D is shifted to scan register 450B, the content of scan register 410 is shifted to scan register 450C, the content of scan register 420C is shifted to scan register 450E, and so forth.

During a second scan out clock cycle, the content of scan register 450A (storing data originally from scan register 420E) is XOR processed, via XOR 460A at compressor 312, with the content of scan register 450B (storing data originally from scan register 420D) and outputted via compressor output 390A. The data of compressor output 390A is stored in scan out register 344A. In addition, the content of scan register 450C (storing data originally from scan register 410)

is stored in scan register 450D, the content of scan register 450E (storing data originally from scan register 420C) is stored in scan register 450F, and so forth.

During a third scan out clock cycle, the content of scan register 450D (storing data originally from scan register 410) is XOR processed, via XOR 470B at compressor 312, with the content of scan register 450F (storing data originally from scan register 420C) and outputted via compressor output 390B. The data of compressor output 390B is XOR processed, via XOR 460A, with the content of scan out register 334A (storing data originally from scan register 420E XOR processed with data originally from scan register 420D).

If this process is continued until the data originally from scan register 420E reaches the output 470, output value of the output 470 when the data originally stored in scan register 420E reaches the output 470 would be as follows:

$$470=420E \oplus 420D \oplus 410 \oplus 420C \oplus 420B \oplus 420A$$

Thus, the "X" value of scan register 410 would be propagated to scan registers 420A through 420E.

Figure 4B:
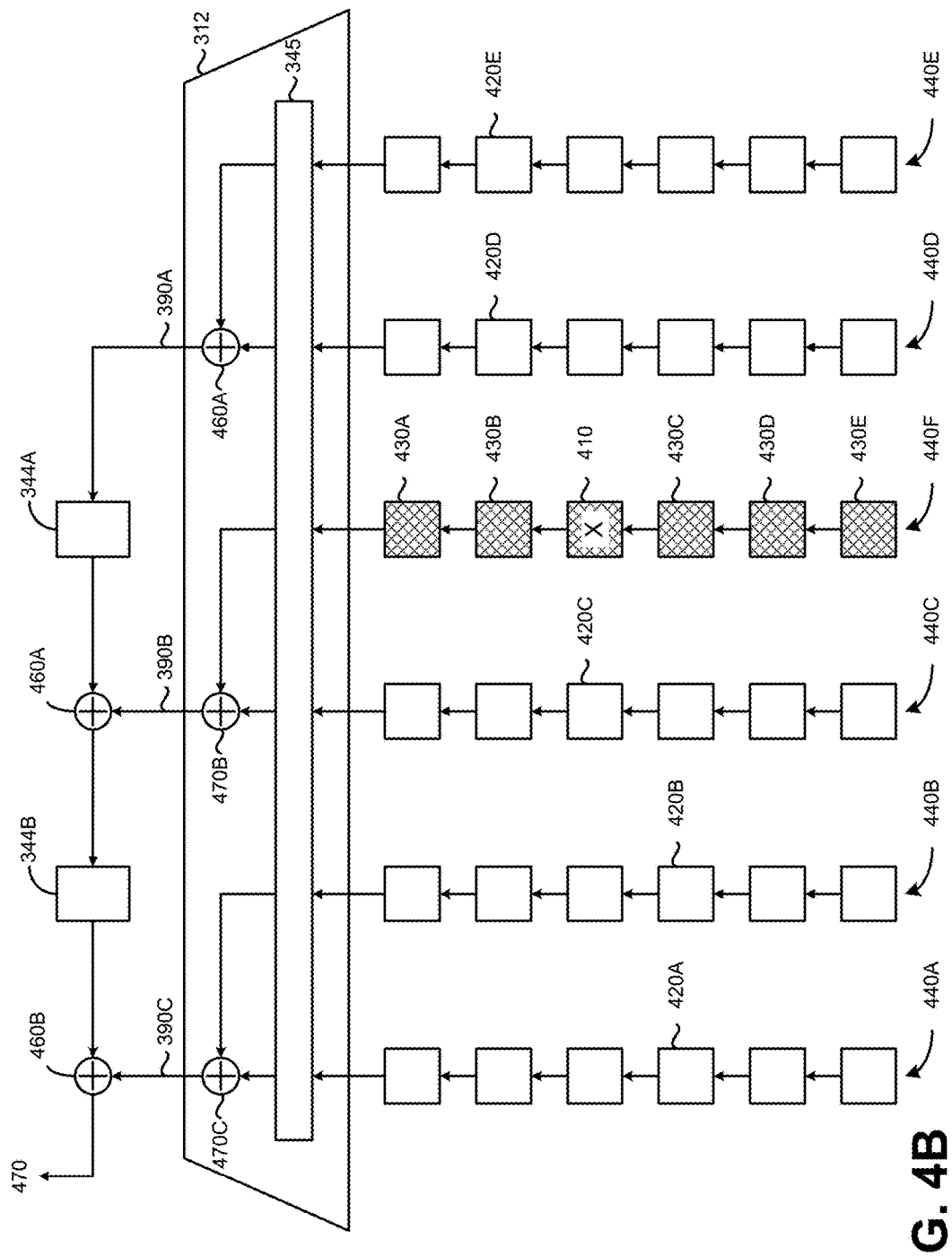
FIG. 4B is a block diagram of a test circuit with a masked scan register having an "X" value, according to one embodiment.

FIG. 4B also illustrates a test circuit 242 with a scan register 410 having an "X" value, but with scan chain 440F masked, according to one embodiment. Since scan chain 440F is masked, none of the scan registers 430A through 430E and 410 of scan chain 440F are observable from the output 470. That is, the contents of scan registers 430A through 430E and 410 cannot be read at the output 470 of the test circuit 242.

As shown in FIG. 4A, if scan chain 440F were not masked, the "X" value of scan register 410 would have propagated to scan registers 420A through 420E, and thus scan registers 420A through 420E would not have been observable at the output 470 of the test circuit 242. Thus, masking scan chain 440F allows scan registers 420A through 420E to be observable at the output 470 of the test circuit 242.

Additionally, if multiple scan registers in the same scan chain 440 have an "X" value, masking the scan chain may increase the number of scan registers that are observable at the output 470 of the test circuit 242. For instance, if both scan registers 410 and 430C have "X" values, the "X" value from scan register 410 may propagate to scan registers 420A through 420E and the "X" value form scan register 430C may propagate to scan registers 480B through 480E. That is, 11 scan registers would not be observable at the output 470 of test circuit 242. Alternatively, if scan chain 440F is masked, only 6 scan chains 430A through 430E and 410 would not be observable at the output 470 of test circuit 242.

FIG. 5A illustrates the expected output pattern of a fault free IC corresponding to a particular test pattern, according to one embodiment. The expected output pattern of FIG. 5A contains 44 "X" values. If the output of the scan chains are compressed, the "X" values from the expected output pattern propagate to known values, as illustrated in FIG. 5B. As illustrated in FIG. 5B, the 44 "X" values of the expected output pattern of FIG. 5A have propagated to 525 "X" values. Such propagation of "X" values reduces the number of observable bits in the expected output pattern, and hence, reduces the number of faults that can be tested using the particular test pattern.

FIG. 5C illustrates an expected output pattern after masking has been performed, according to one embodiment. In this example, masking certain scan chains reduces the propagation of the "X" values and increases the number of observable bits in the output pattern. For example, the masked version of the output pattern illustrated in FIG. 5C contains 245 "X" values instead of 525 "X" values in the unmasked version of the output pattern illustrated in FIG. 5B. Therefore, in this example, the number of observable bits in the output pattern is increased, consequently increasing the number of faults that can be tested using the particular test pattern.

By protecting a primary fault, many secondary and/or tertiary faults otherwise detectable using a test pattern may become unobservable or undetectable due to masking out of relevant scan chain output as a result of applying the test pattern. As a result, the total number of faults testable by the test pattern may be decreased, and the number of test patterns to provide a desired coverage against faults in the IC may be increased. To decrease the number of test patterns to provide the desired coverage, embodiments divide ATPG process into two stages, a first stage where the ATPG process generates masks that focus on increasing the observability of a test pattern without differentiating primary, secondary and tertiary faults, and a subsequent second stage where the ATPG process generates test patterns configured with masks that protect primary faults.

As used herein, "protecting" a particular fault refers to a masking scheme that allows the protected fault to remain observable or testable.

By not protecting primary faults during the first stage of the ATPG process, a larger number of faults may be tested with a lower number of test patterns. Since the primary faults are not protected, if the primary fault of a test pattern in combined with an "X" value, or if the primary fault is not observable at the output of the test circuit 242, the primary fault may be used during a subsequent test to generate a new test pattern. In some embodiments, if a primary fault is not observable at the output of the test circuit 242, the primary fault is not used for generating a new test pattern until the second stage of the ATPG process.

As used herein, the "observability" refers to the number of bits in the scan chain outputs of a test pattern that can be known or determined (i.e., not unknown).

Figure 6A:
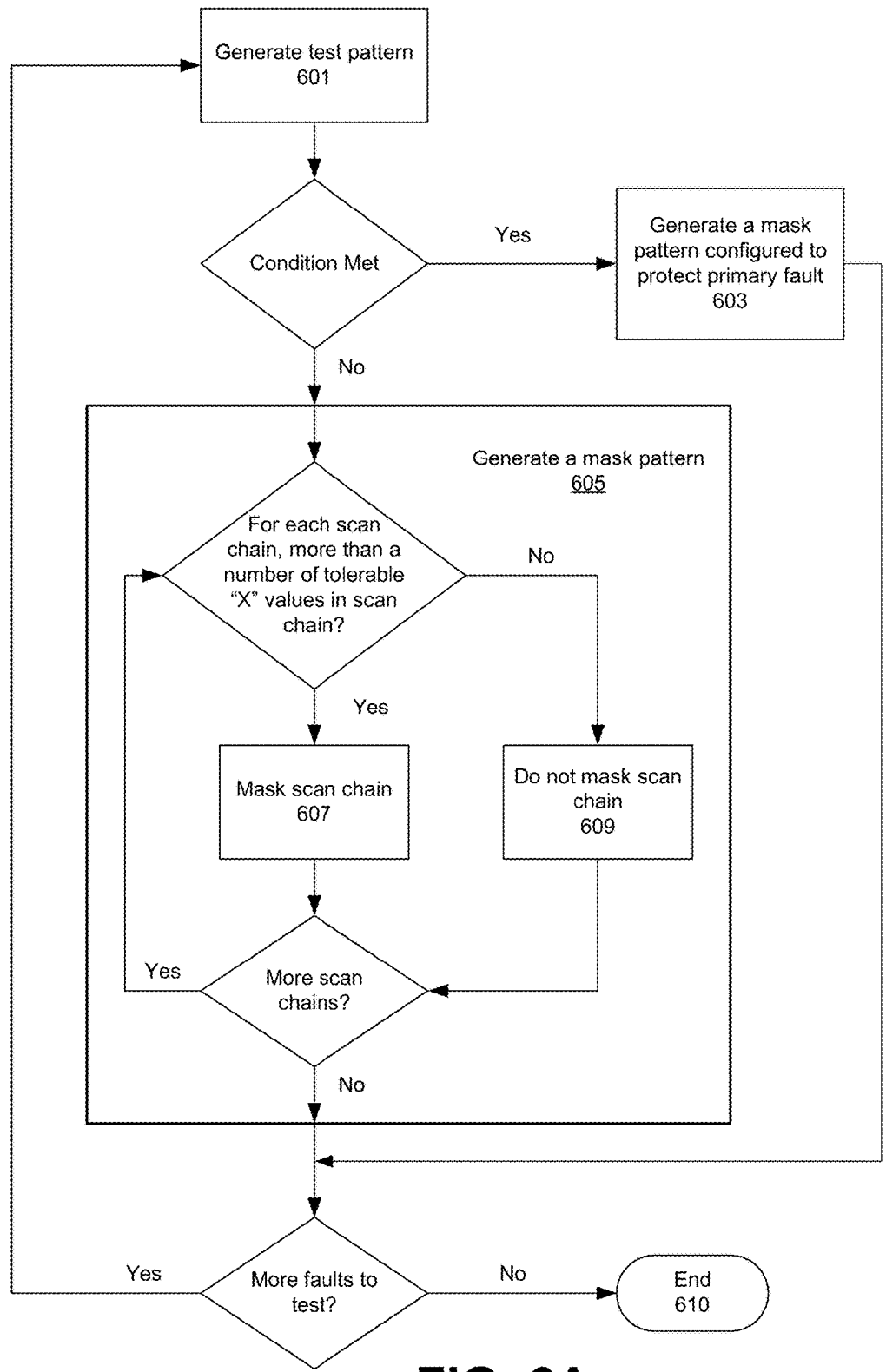
FIG. 6A is a flow diagram for a process of generating a mask pattern for a particular test pattern to be used in the ATPG process, according to one embodiment.

FIG. 6A is a flow diagram for a process of generating a mask pattern for a particular test pattern to be used in the ATPG process, according to one embodiment. First, a test pattern is generated 601. The test pattern tests a primary fault, and a combination of secondary and tertiary faults. If a certain condition is not met, then a mask pattern increasing the observability of the test pattern is generated 605. Conversely, if the condition is met, then a mask pattern configured to protect the primary fault is generated 603.

If there are more faults to be tested, a new test pattern 601 is generated using at least one fault of the remaining faults to be tested as a primary fault. If there are no more faults to be tested, the process ends 610.

In one embodiment, the condition that needs to be met to protect primary faults is whether the number of remaining faults for testing is lower than a threshold (e.g., 1000 faults left to be tested). In other embodiment, the condition is that the number of tests already performed is beyond a threshold value (e.g., 2000 tests). The threshold value associated with the condition may be a predetermined value (e.g., 10% of the total number of faults to be tested). In other embodiment, the threshold value can be determined based on the outcome of the simulation. For example, the mask pattern generation can switch from protecting tertiary faults to protecting primary faults when the number of new faults tested with a particular test pattern is below a predetermined number (e.g., number of new faults tested is below 1000). In another example, the mask pattern generation may switch from protecting tertiary faults to protecting primary faults when the ratio of secondary faults tested compared to the number of secondary faults the test patter was designed to test is below a predetermined value (e.g., 25%).

Figure 8:
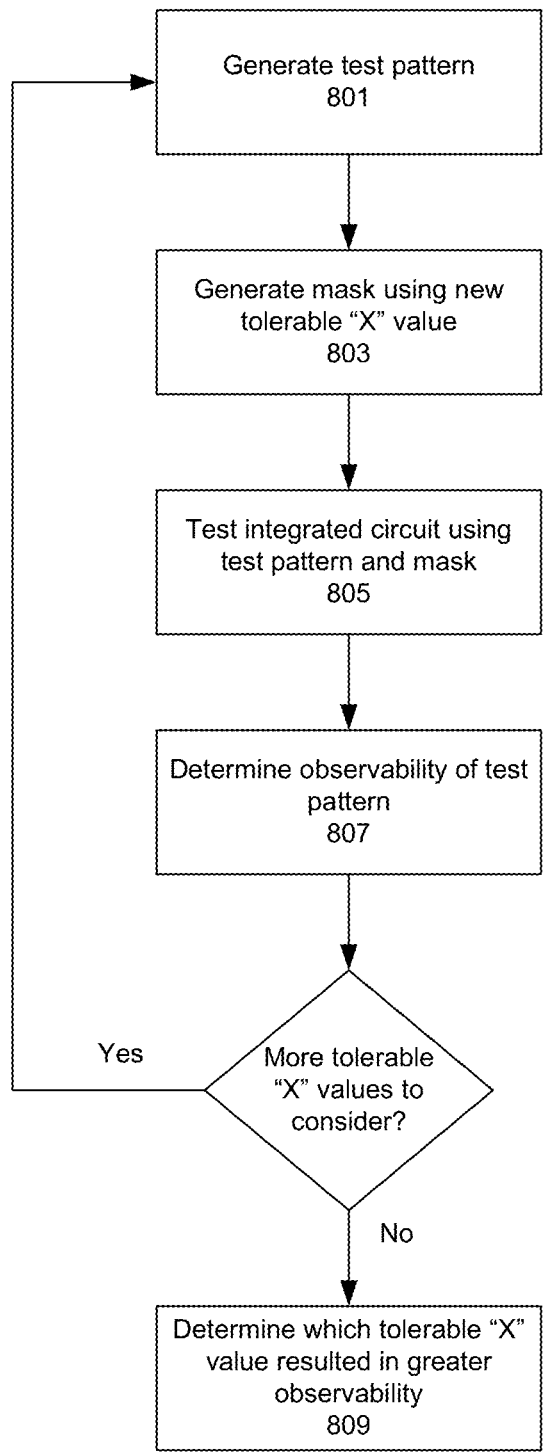
FIG. 8 is a flow diagram of an auto-calibration process for determining a new tolerable "X" value, according to one embodiment.

To generate 605 a mask pattern that protects a plurality of tertiary faults, the number of "X" values for each scan chain is determined. If the number of "X" values for a scan chain is larger than a number of tolerable "X" values, the scan chain is masked 607. Otherwise, the scan chain is not masked 609. In one embodiment the number of tolerable "X" values is a fixed value (e.g., 10 "X" values in a scan chain, or 10% of the scan chain). In other embodiments, the number of tolerable "X" values can change during ATPG process. For example, the number of tolerable "X" values can be changed during the ATPG process using an auto-calibration process, as shown in FIG. 8. In yet other embodiments, the number of tolerable "X" values is equal to or greater than the length of the scan chain. That is, in this embodiment, scan chains are not masked regardless of the number of "X" values in the scan chain. A determination as to where there are more scan chains is made. If there are more scan chains, the process is repeated for the remaining scan chains. If there are no more scan chains, the mask generation 605 is completed.

Figure 6B:
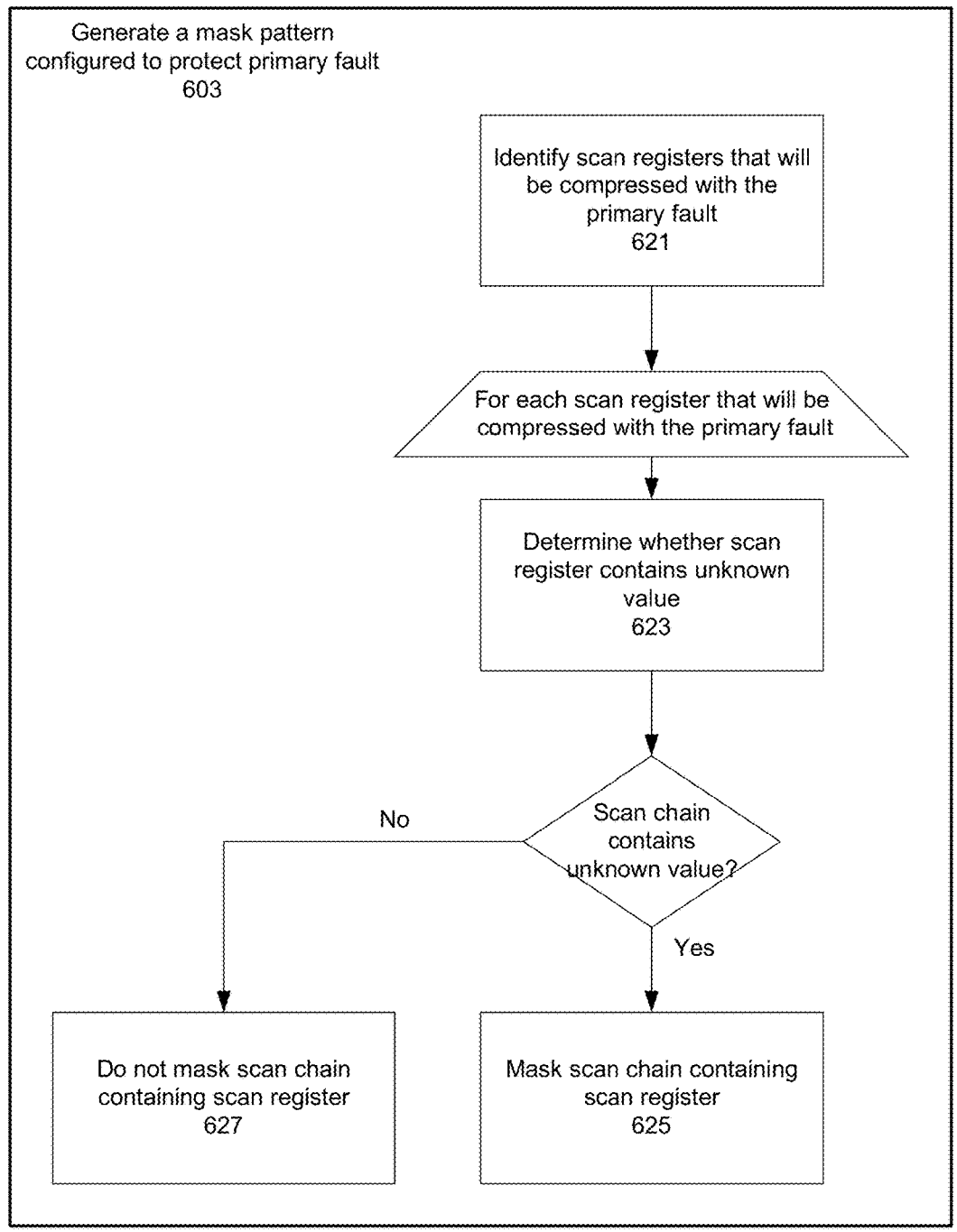
FIG. 6B is a flow diagram for a process of generating a mask pattern configured to protect primary fault, according to one embodiment.

FIG. 6B is a flow diagram for a process of generating a mask pattern configured to protect primary fault, according to one embodiment. Scan registers that will be combined with the primary fault during scan out compression are identified 621. For each of the scan registers that will be combined with the primary faults, a determination is made as to whether the scan register contains an unknown value 623. If a scan register contains an unknown value, the scan chain containing the scan register is masked 625. If the scan register does not contain an unknown value, the scan chain containing the scan register is not masked 627.

In some embodiments, after the primary fault has been protected, the ATPG may mask other scan chains to increase the number of tertiary faults tested. For instance, for the scan chains that were not masked to protect the primary fault, a determination is made whether a number of "X" values of the scan chain is larger than a number of tolerable "X" values. If the scan chain does not contain the primary fault, and the number of "X" values is larger than the number of tolerable "X" values, then the scan chain is masked. Otherwise, if the scan chain contains the primary fault, or the number of "X" values is smaller than the number of tolerable "X" values, then the scan chain is not masked.

In some embodiments, if the primary fault is not protected after performing the process of FIG. 6B, the fanout of the scan chains may be changed. For instance, scan chains having multiple fanouts may be changed to having single fanouts. The process of FIG. 6B may be repeated with the new fanouts.

Figure 7:
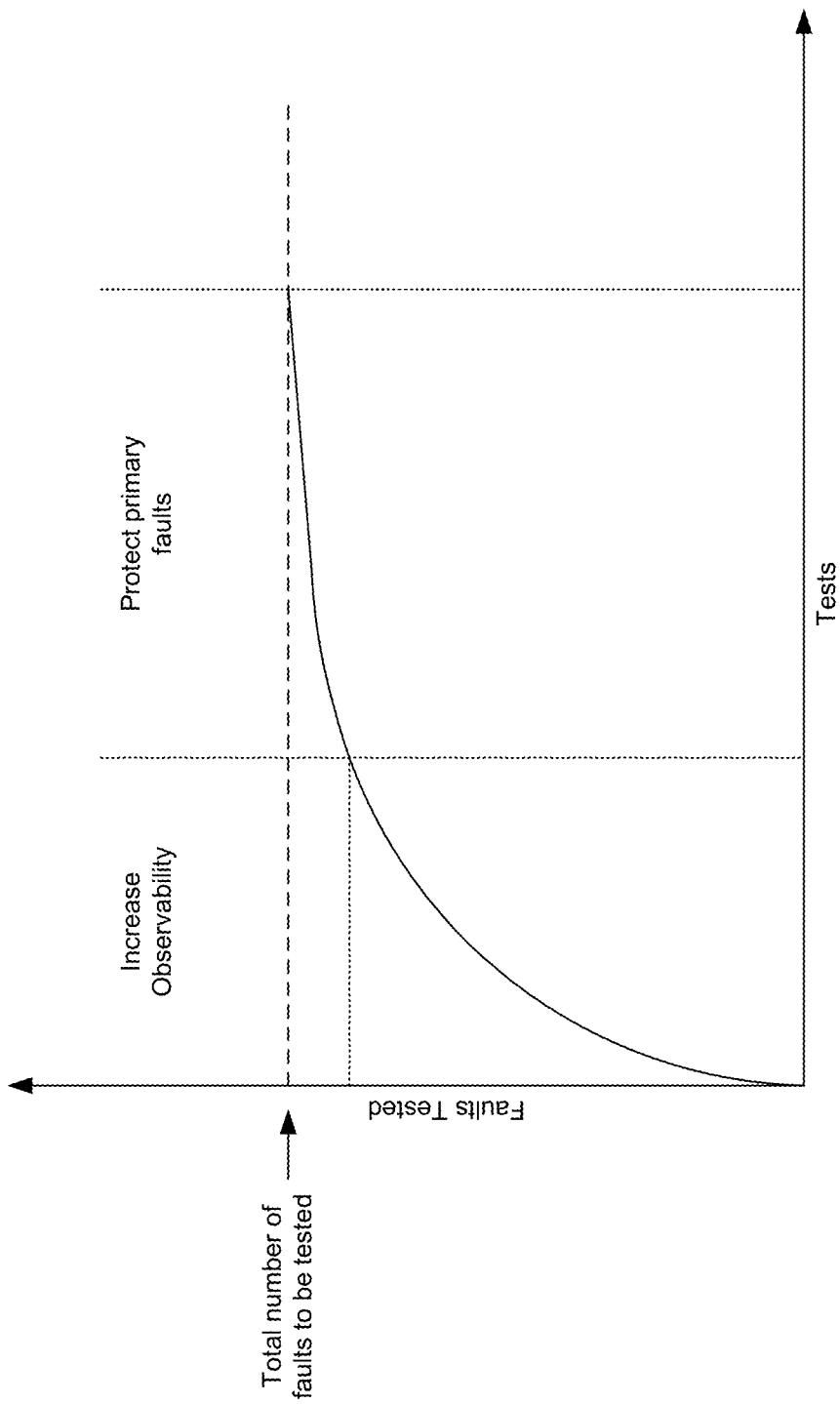
FIG. 7 is a graph illustrating the number of faults tested as a function of the number of tests performed, according to one embodiment.

FIG. 7 shows a graph of the number of faults tested as a function of the number of testes performed. The test process is divided into two stages. In the first stage the ATPG/FS generates a mask pattern that protects tertiary faults. At this stage, if a masking of scanning chains renders a primary fault of a test pattern to be unobservable, the primary fault may be tested later using another test pattern.

When the number of faults left to be tested is below a threshold value, the ATPG/FS switches from increasing observability of a test pattern to protecting primary faults. During this stage, if a primary fault for a particular test pattern cannot be tested, the primary fault is determined to be untestable and it may not be selected to be a primary fault for a subsequent test pattern.

As the testing of the DUT progresses and fewer faults are left to test, the number of tolerable "X" values may be changed by the ATPG. For instance, as the ATPG periodically determine a number of tolerable "X" values used for determining whether to mask a scan chain, that increases the number of secondary and tertiary faults tested.

FIG. 8 illustrates a flow diagram of an auto-calibration process for determining a new tolerable "X" value, according to one embodiment. A test pattern is generated 801. A mask is generated for the test pattern using a first tolerable "X" value. The DUT 206 is tested 805 using the generated test pattern and mask and the observability of the test pattern is determined 807.

These steps are repeated using different tolerable "X" values until a predetermined number of tolerable "X" values are tested. In one embodiment, the auto-calibration process considers all possible tolerable "X" values within plus or minus a range (e.g., 10) from the current tolerable "X" value (e.g., if the current tolerable "X" value is 10, the auto-calibration process may consider 7, 8, 9, 10, 11, 12, and 13 as possible tolerable "X" values). In another embodiment, the auto-calibration process may consider select tolerable "X" values as:

Select Tolerable "$X$" Value=Current Tolerable "$X$" Value$\pm k \times \Delta$ where k may be an integer (e.g., 1, 2, 3) and $\Delta$ is predefined constant (e.g., 2). For example, if $\Delta$ is 2, the auto-calibration process may consider 6, 8, 10, 12, and 14 as possible tolerable "X" values. After all the possible tolerable "X" to be considered are tested, the possible tolerable "X" with the greater observability is determined 809.

In one embodiment, the auto-calibration process is performed every predefined number of test patterns (e.g., every 1000 test patterns). In other embodiments, the auto-calibration process is performed every time the observability of a test is below an observability threshold value.

Figure 9:
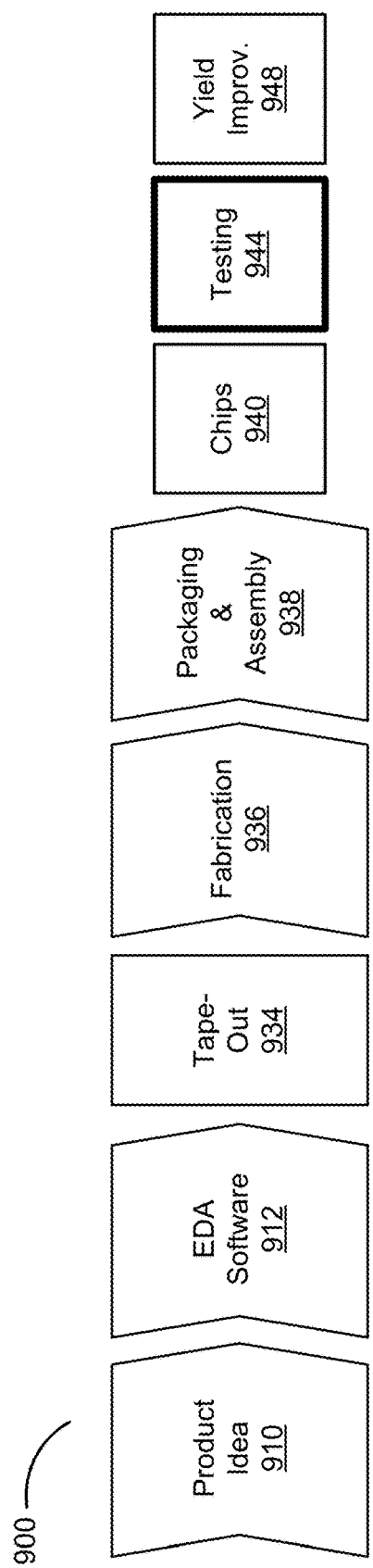
FIG. 9 is flow diagram illustrating the various operations in the design and fabrication of an integrated circuit, according to one embodiment.

FIG. 9 is a flowchart 900 illustrating the various operations in the design and fabrication of an integrated circuit. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., gates, metal layers, vias) in the integrated circuit design. Packaging and assembly processes 938 are performed, which result in finished chips 940. Chips are then tested 944 to detect faults. Based on the detected faults in the tested chips, measures can be taken to improve yield 948 in subsequent batch of chips to be fabricated. Embodiments described above primarily related to testing 944 the chips for faults.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

While particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope of this disclosure.

What is claimed is:

1. A computer implemented method for calibrating mask patterns, the method comprising:
    generating, by a computer, a current test pattern including first input values for detecting a first set of faults in an integrated circuit;
    testing the integrated circuit using the current test pattern and a current corresponding mask pattern;
    generating, by the computer, a next test pattern subsequent to the current test pattern, the next test pattern including second set of input values for detecting a second set of faults in the integrated circuit;
    selecting a plurality of tolerable unknown values, each of the plurality of unknown values representing a threshold number of unknown values in an output of a scan chain above which the output of the scan chain is masked;
    for each tolerable unknown value of the plurality of tolerable unknown values:
        generating a mask pattern based on the tolerable unknown value corresponding to the next test pattern, the generated mask pattern instructing a test circuit of the integrated circuit to mask a scan chain responsive to a number of unknown values in the scan chain being larger than the tolerable unknown value,
        testing the integrated circuit using the generated test pattern and the generated mask pattern, and
        determining an observability value of the test performed based on the generated test pattern and mask pattern, the observability value representing a number of faults observable in a test of the integrated circuit using the test pattern and the mask pattern;
    ranking the plurality of tolerable unknown values based on the observability of the next test pattern associated with each of the plurality of tolerable unknown values; and
    selecting a tolerable unknown value for one or more test patterns subsequent to the next test pattern based on the ranking.

2. The computer implemented method of claim 1, wherein selecting the tolerable unknown value comprises selecting the tolerable unknown value that results in a test with a greatest observability value.

3. The computer implemented method of claim 1, wherein the plurality of tolerable unknown values include values within a threshold value of a current tolerable unknown value.

4. The computer implemented method of claim 1, wherein the selected tolerable unknown value is maintained for a predetermined number of test patterns subsequent to the next test pattern.

5. The computer implemented method of claim 1, wherein the next test pattern includes a plurality of input values for detecting a primary fault representing a fault for which an initial subset of input values in the next test pattern is generated, at least one secondary fault representing a fault detectable by specifying input values other than the initial subset of input values, and at least one tertiary fault representing a fault detectable by the next test pattern specified with the input values for the primary and the at least one secondary fault.

6. A system comprising:
    a test pattern generator configured to generate a current test pattern and a next test pattern, the next test pattern including a plurality of input values for detecting a plurality of faults in an integrated circuit; and
    a mask generation calibration module configured to:
        select a plurality of tolerable unknown values, each of the plurality of unknown values representing a threshold number of unknown values in an output of a scan chain above which the scan chain is masked;
        for each tolerable unknown value of the plurality of tolerable unknown values:
            generate a mask pattern based on the tolerable unknown value corresponding to the next test pattern, the generated mask pattern instructing a test circuit of the integrated circuit to mask a scan chain responsive to a number of unknown values in the scan chain being larger than the tolerable unknown value,
            test the integrated circuit using the generated test pattern and the generated mask pattern, and
            determine an observability value of the test performed based on the generated test pattern and mask pattern, the observability value representing a number of faults observable in a test of the integrated circuit using the test pattern and the mask pattern;
        rank the plurality of tolerable unknown values based on the observability of the test associated with each of the plurality of tolerable unknown values; and
        select a tolerable unknown value for one or more test patterns subsequent to the next test pattern based on the ranking.

7. The system of claim 6, wherein selecting the tolerable unknown value comprises selecting the tolerable unknown value that results in a test with a greatest observability value.

8. The system of claim 6, wherein the plurality of tolerable unknown values include values within a threshold value of a current tolerable unknown value.

9. The system of claim 6, wherein the selected tolerable unknown value is maintained for a predetermined number of test patterns subsequent to the next test pattern.

10. The system of claim 6, wherein the next test pattern includes a plurality of input values for detecting a primary fault representing a fault for which an initial subset of input values in the next test pattern is generated, at least one secondary fault representing a fault detectable by specifying input values other than the initial subset of input values, and at least one tertiary fault representing a fault detectable by the next test pattern specified with the input values for the primary and the at least one secondary fault.

11. A non-transitory computer readable medium configured to store instructions for calibrating mask patterns, the instructions when executed by a processor cause the processor to:

generate a current test pattern including first input values for detecting a first set of of faults in an integrated circuit;

test the integrated circuit using the current test pattern and a current corresponding mask pattern;

generate a next test pattern subsequent to the current test pattern, the next test pattern including second set of input values for detecting a second set of faults in the integrated circuit;

select a plurality of tolerable unknown values, each of the plurality of unknown values representing a threshold number of unknown values in an output of a scan chain above which the output of the scan chain is masked;

for each tolerable unknown value of the plurality of tolerable unknown values:

generate a mask pattern based on the tolerable unknown value, the generated mask pattern instructing a test circuit of the integrated circuit to mask a scan chain responsive to a number of unknown values in the scan chain being larger than the tolerable unknown value, test the integrated circuit using the generated test pattern and the generated mask pattern, and determine an observability value of the test performed based on the generated test pattern and mask pattern, the observability value representing a number of faults observable in a test of the integrated circuit using the test pattern and the mask pattern;

rank the plurality of tolerable unknown values based on the observability of the test associated with each of the plurality of tolerable unknown values; and select a tolerable unknown value for one or more test patterns subsequent to the next test pattern based on the ranking.

12. The non-transitory computer readable medium of claim 11, wherein the instructions for selecting the tolerable unknown value cause the processor to:

select the tolerable unknown value that results in a test with a greatest observability value.

13. The non-transitory computer readable medium of claim 11, wherein the plurality of tolerable unknown values include values within a threshold value of a current tolerable unknown value.

14. The non-transitory computer readable medium of claim 11, wherein the selected tolerable unknown value is maintained for a predetermined number of test patterns subsequent to the next test pattern.

15. The non-transitory computer readable medium of claim 11, wherein the next test pattern includes a plurality of input values for detecting a primary fault representing a fault for which an initial subset of input values in the next test pattern is generated, at least one secondary fault representing a fault detectable by specifying input values other than the initial subset of input values, and at least one tertiary fault representing a fault detectable by the next test pattern specified with the input values for the primary and the at least one secondary fault.

* * * * *